United States Patent [19]
Delano

[11] Patent Number: 5,754,079
[45] Date of Patent: May 19, 1998

[54] METHOD AND APPARATUS FOR BIASING A DIFFERENTIAL CASCODE CIRCUIT

[75] Inventor: Cary Delano, San Jose, Calif.

[73] Assignee: Tripath Technology, Inc., Santa Clara, Calif.

[21] Appl. No.: 738,230

[22] Filed: Oct. 25, 1996

[51] Int. Cl.[6] .................................................. H03F 3/45
[52] U.S. Cl. .................................... 330/310; 330/261
[58] Field of Search .............................. 330/253, 260, 330/261, 310, 311

[56] References Cited

U.S. PATENT DOCUMENTS

| | | | |
|---|---|---|---|
| 4,366,446 | 12/1982 | Henderson et al. | 330/260 |
| 5,202,645 | 4/1993 | Phan et al. | 330/253 |
| 5,389,891 | 2/1995 | Phillippe | 330/253 |
| 5,444,414 | 8/1995 | Delano | 330/253 X |

Primary Examiner—Steven Mottola
Attorney, Agent, or Firm—Townsend and Townsend and Crew LLP; Kenneth R. Allen

[57] ABSTRACT

A method and apparatus for biasing a differential cascade circuit are provided. The differential cascade circuit includes a first cascade circuit having a first transistor coupled to a second transistor at a first node, and a second cascade circuit having a third transistor coupled to a fourth transistor at a second node. A sensing circuit senses a first differential voltage between the first and second nodes. In response to the sensing of the first differential voltage, a voltage adjusting circuit coupled to the sensing circuit applies a second differential voltage between the gate terminals of the second and fourth transistors such that the first differential voltage is minimized.

5 Claims, 4 Drawing Sheets

METHOD AND APPARATUS FOR BIASING A DIFFERENTIAL CASCODE CIRCUIT

BACKGROUND OF THE INVENTION

The present invention relates to a method and apparatus for biasing a differential cascade circuit. More specifically, the present invention provides a biasing scheme for a differential cascade circuit which maintains a high incremental differential output impedance, mitigates early voltage degradation, and requires a relatively small amount of IC real estate.

As semiconductor device manufacturing technology advances further into the submicron range, the early voltages of short channel devices are increasingly degrading. FIG. 1 shows a typical $i_d$ vs. $V_{ds}$ characteristic for a p-channel enhancement mode field effect transistor (FET) 100. As shown, the early voltage $V_A$ is defined by the point of intersection of the $V_{ds}$ curves (extended from the linear region) and the horizontal axis, i.e., where $i_d$=0. As the channels of such FETs become shorter, the early voltage moves to the right (as indicated by arrow 102, resulting in linear region $v_{gs}$, curves of greater and greater slope. Because the incremental output impedance is defined by the slope of the $v_{gs}$ curves, i.e., $\Delta v_{ds}/\Delta i_d$, the output impedance of the device degrades as $V_A$ degrades.

Traditionally, cascade configurations such as the one shown in FIG. 2 have been employed to boost output impedances. Resistors 202 and 204 across pmos devices 206 and 208 represent the incremental output impedances of the devices. By appropriately biasing the gates of devices 206 and 208, i.e., with bias1 and bias2, the small-signal current through resistor 202 is brought as close to zero as possible, thus making the effective incremental output impedance of device 206 very large. Bias1 and bias2 are standard bias voltages for a cascade circuit which depend upon the parameters of the cascode transistors and may be set according to a variety of well known techniques. Unfortunately, as device dimensions decrease, the simple cascode of FIG. 2 becomes insufficient for high gain stages and current sources.

Some improved cascading techniques such as the circuits of FIGS. 3 and 4 have been implemented. In FIG. 3, an op amp 302 is employed to force the voltage at the source of device 304 to remain at the same level as the bias voltage (bias3) applied at the non-inverting input of op amp 302. Because the voltage at this point remains substantially fixed, the voltage across device 306 remains substantially fixed and there is little or no small-signal current through device 306. Thus, the effective incremental output impedance of device 306 is very large. FIG. 4 shows the biasing circuit of FIG. 3 used in a differential circuit with an op amp biasing the lower device in each current path, i.e., op amps 402 and 404. Bias1 is essentially the same voltage in FIGS. 2–4. Bias3 is also a standard cascode bias voltage and may be set according to a variety of well known techniques. Unfortunately, while these circuits of FIGS. 3 and 4 are relatively effective at maintaining a high incremental output impedance, they typically consume an undesirable amount of valuable integrated circuit area.

A cascading configuration is therefore desirable which maintains a high incremental output impedance without consuming precious IC resources.

SUMMARY OF THE INVENTION

The present invention provides a method and apparatus for biasing a differential cascade circuit which maintains a high differential output impedance without consuming much IC real estate. According to a specific embodiment, the invention senses the voltage between the sources of the lower two transistors of the differential cascode circuit, counteracting any small-signal differential between the two by driving the gates of the lower two transistors appropriately. By maintaining essentially the same voltage at these nodes, the differential small-signal current through the upper two transistors of the differential cascode circuit is maintained near zero. Thus, the differential output impedance of the upper two transistors (and therefore of the entire cascode circuit) is very large.

This is achieved in a specific embodiment using a differential input stage and a negative impedance converter (NIC). The differential inputs of the differential input stage sense the sources of the lower two transistors of the differential cascode circuit. When there is any variation between these two nodes, the variation is amplified by the different currents flowing through the high impedance NIC. This amplified voltage is applied to the gates of the lower two transistors of the differential cascade circuit to force the differential voltage between the sources of these two transistors to zero. In this way, the differential small-signal current in the upper two transistors of the differential cascode circuit is minimized and the differential output impedance is maintained at a very high level.

Thus, according to the present invention, a method and apparatus for biasing a differential cascode circuit are provided. The differential cascade circuit includes a first cascode circuit having a first transistor coupled to a second transistor at a first node, and a second cascode circuit having a third transistor coupled to a fourth transistor at a second node. A sensing circuit senses a first differential voltage between the first and second nodes. In response to the sensing of the first differential voltage, a voltage adjusting circuit coupled to the sensing circuit applies a second differential voltage between the gate terminals of the second and fourth transistors such that the first differential voltage is minimized.

A further understanding of the nature and advantages of the present invention may be realized by reference to the remaining portions of the specification and the drawings.

DESCRIPTION OF THE PREFERRED EMBODIMENT

Figure 1:
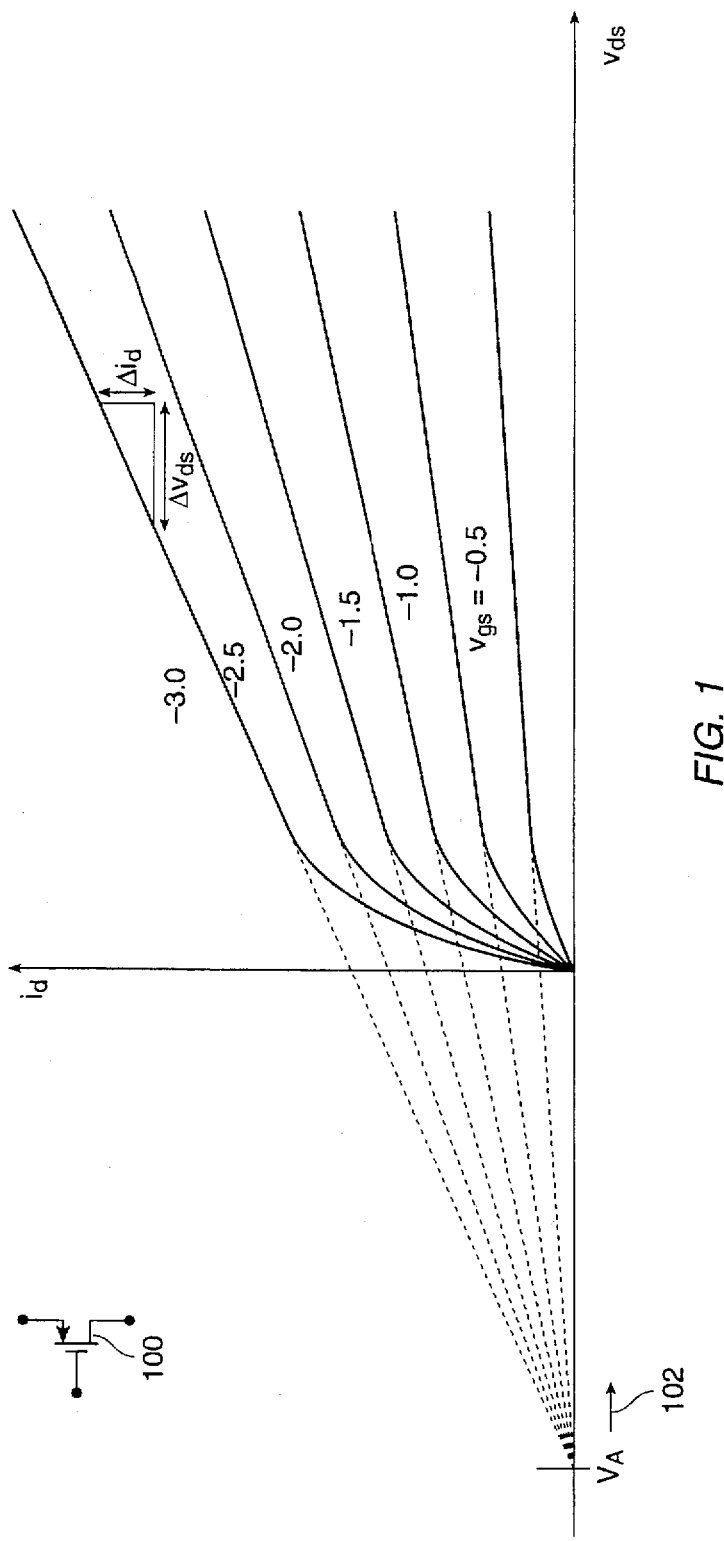
FIG. 1 is a typical FET characteristic.
Figure 2:
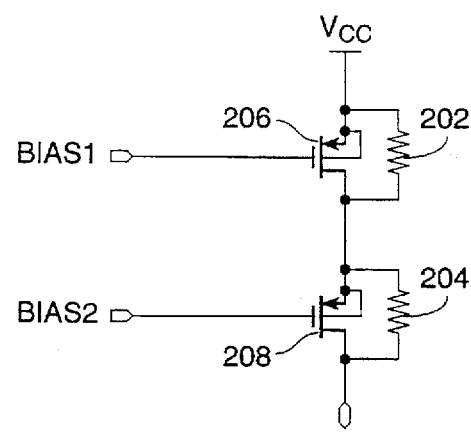
FIG. 2 shows a standard cascode configuration.
Figure 3:
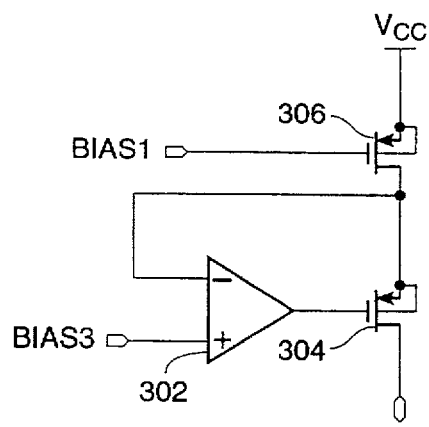
FIG. 3 shows one example of an improvement over the standard cascode circuit.
Figure 4:
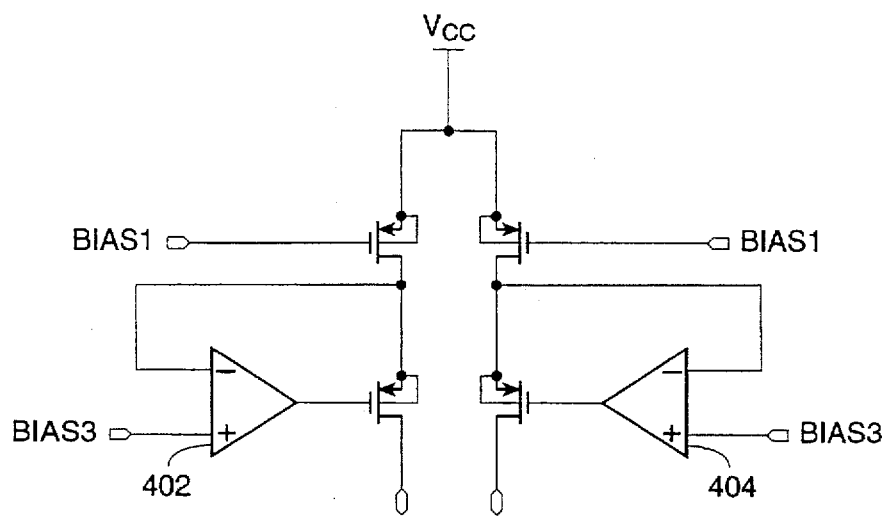
FIG. 4 shows another example of an improvement over the standard cascode circuit.
Figure 5:
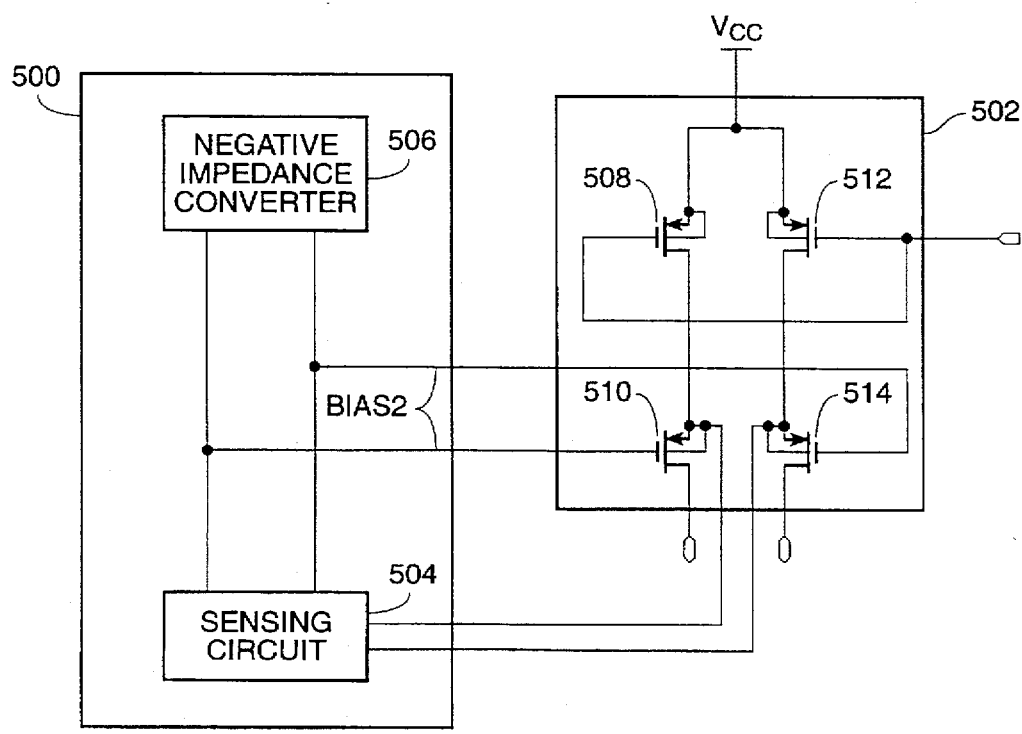
FIG. 5 shows a biasing scheme for a differential cascode circuit according to a specific embodiment of the invention.

FIG. 5 shows a biasing circuit 500 for a differential cascode circuit 502 according to a specific embodiment of the invention. Biasing circuit 500 includes a sensing circuit 504 and a negative impedance converter (NIC) 506. Differential cascode circuit 502 includes a first cascode comprising transistors 508 and 510, and a second cascode comprising transistors 512 and 514. The gates of transistors 508 and 512 are biased at bias1 (as discussed above) using any of a variety of well known techniques. Sensing circuit 504 senses the differential voltage between the sources of transistors 510 and 514. Any small-signal variations in this voltage are amplified via NIC 506 and applied differentially to the gates of transistors 510 and 514 such that the differential voltage between the sources of transistors 510 and 514 is forced to zero. The common mode voltage at the sources of transistors 510 and 514 is set by introducing bias2 (discussed above) at the gates of these transistors through any of a variety of techniques.

Figure 6:
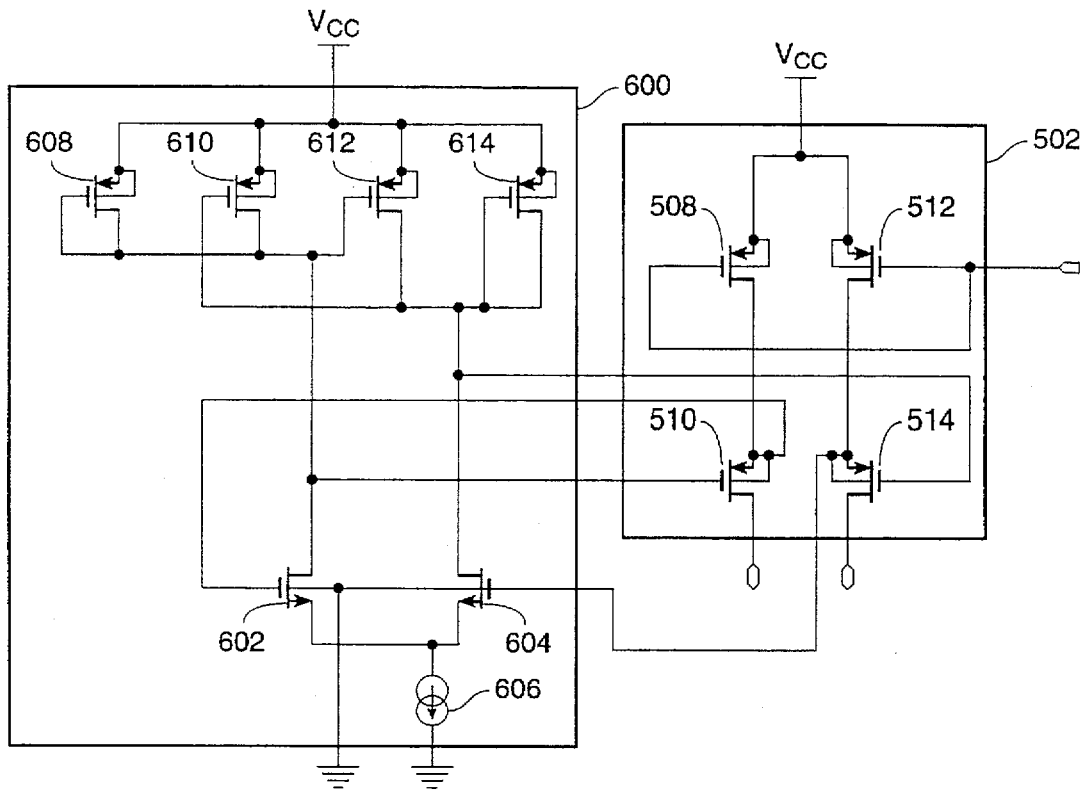
FIG. 6 shows a biasing scheme for a differential cascode circuit according to a more specific embodiment of the invention.

FIG. 6 shows a biasing circuit 600 for differential cascode circuit 502 according to a more specific embodiment of the invention. As with the embodiment of FIG. 5, the gates of transistors 508 and 512 are biased at bias1 using any of a variety of well known techniques. Transistors 602 and 604 form a differential input stage which senses the differential voltage between the sources of transistors 510 and 514. Current source 606 causes the bias voltage at the gates of transistors 510 and 514 to be set at bias2, thereby setting the common mode voltage of cascode circuit 502. Any small signal variations between these nodes are amplified by the sinking of current by transistors 602 and 604 through a negative impedance converter (NIC) comprising transistors 608, 610, 612 and 614. The NIC presents a very large effective impedance to the differential input stage resulting in amplification on the same order of magnitude as that provided by an operational amplifier. The differential voltage between the drains of transistors 602 and 604 is then applied to the gates of transistors 510 and 514 such that the differential voltage between the sources of transistors 510 and 514 is minimized. By maintaining this differential voltage near zero, the differential small-signal current through transistors 508 and 512 is minimized resulting in a high incremental differential output impedance of cascode circuit 502.

Figure 7:
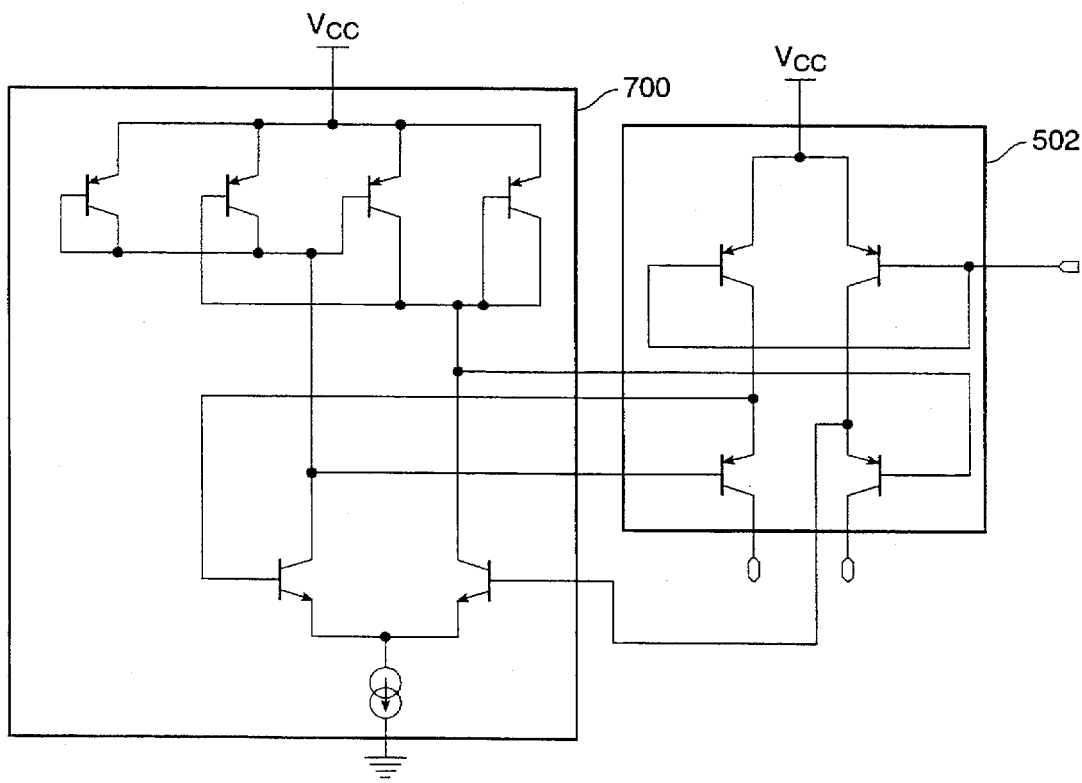
FIG. 7 shows a biasing scheme for a differential cascode circuit according to another specific embodiment of the invention.

While the invention has been particularly shown and described with reference to specific embodiments thereof, it will be understood by those skilled in the art that the foregoing and other changes in the form and details may be made therein without departing from the spirit or scope of the invention. For example, the present invention has been described primarily with regard to implementation using field effect transistor technology, but it will be understood that the invention may just as easily be implemented using bipolar transistor technology. An example of such an embodiment is shown as biasing circuit 700 of FIG. 7. Furthermore, the same circuits can be used with nmos devices by using ground as a reference instead of $V_{CC}$ and small modifications to the topology. The scope of the invention should therefore be determined by reference to the appended claims.

What is claimed is:

1. An apparatus for biasing a differential cascade circuit, the differential cascade circuit comprising a first cascade circuit having a first transistor coupled to a second transistor at a first node, and a second cascade circuit having a third transistor coupled to a fourth transistor at a second node, each of the transistors having a gate terminal, the apparatus comprising:

a sensing circuit for sensing a first differential voltage between the first and second nodes; and a voltage adjusting circuit coupled to the sensing circuit for applying a second differential voltage between the gate terminals of the second and fourth transistors in response to sensing of the first differential voltage;

wherein the first differential voltage is minimized by application of the second differential voltage.

2. The apparatus of claim 1 wherein the voltage adjusting circuit comprises a negative impedance converter.

3. The apparatus of claim 1 wherein the sensing circuit comprises a differential input stage.

4. An apparatus for biasing a differential cascade circuit, the differential cascade circuit comprising a first cascade circuit having a first transistor coupled to a second transistor at a first node, and a second cascade circuit having a third transistor coupled to a fourth transistor at a second node, each of the transistors having a gate terminal, the apparatus comprising:

a differential input stage for sensing a first differential voltage between the first and second nodes; and a negative impedance converter coupled to the differential input stage for applying a second differential voltage between the gate terminals of the second and fourth transistors in response to sensing of the first differential voltage;

wherein the first differential voltage is minimized by application of the second differential voltage.

5. A method for biasing a differential cascode circuit, the differential cascade circuit comprising a first cascode circuit having a first transistor coupled to a second transistor at a first node, and a second cascode circuit having a third transistor coupled to a fourth transistor at a second node, each of the transistors having a gate terminal, the method comprising the steps of:

sensing a first differential voltage between the first and second nodes; and in response to the sensing step, applying a second differential voltage between the gate terminals of the second and fourth transistors;

wherein the first differential voltage is minimized by application of the second differential voltage.

* * * * *

UNITED STATES PATENT AND TRADEMARK OFFICE
CERTIFICATE OF CORRECTION

PATENT NO. : 5,754,079
DATED     : May 19, 1998
INVENTOR(S) : Cary Delano

It is certified that error appears in the above-indentified patent and that said Letters Patent is hereby corrected as shown below:

Title page, item [57],

Abstract, line 1, replace "cascade" with --cascode--
line 3, replace "cascade" with --cascode--
line 4, replace "cascade" with --cascode--

Column 1, line 7, replace "cascade" with --cascode--
line 9, replace "cascade" with --cascode--
line 27, replace "cascade" with --cascode--
line 36, replace "cascade" with --cascode--
line 41, replace "cascading" with --cascoding--
line 55, replace "cascade" with --cascode--

Column 4, line 2, replace "cascade" with --cascode--
line 3, replace "cascade" with --cascode-- (2 instances)
line 5, replace "cascade" with --cascode--
line 22, replace "cascade" with --cascode--
line 23, replace "cascade" with --cascode-- (2 instances)
line 25, replace "cascade" with --cascode--

Signed and Sealed this

Twenty-fifth Day of August, 1998

*Attest:*

BRUCE LEHMAN

*Attesting Officer*    *Commissioner of Patents and Trademarks*